(12) United States Patent
Park et al.

(10) Patent No.: US 11,972,702 B2
(45) Date of Patent: Apr. 30, 2024

(54) DISPLAY MODULE AND ELECTRONIC APPARATUS HAVING THE SAME

(71) Applicant: SAMSUNG DISPLAY CO., LTD., Yongin-si (KR)

(72) Inventors: Sungjune Park, Suwon-si (KR); Byeongkyu Park, Asan-si (KR); Jaiku Shin, Hwaseong-si (KR); Dong-Youb Lee, Cheonan-si (KR); Sunhaeng Cho, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 368 days.

(21) Appl. No.: 17/359,963

(22) Filed: Jun. 28, 2021

(65) Prior Publication Data

US 2022/0084444 A1 Mar. 17, 2022

(30) Foreign Application Priority Data

Sep. 11, 2020 (KR) .......................... 10-2020-0116555

(51) Int. Cl.
*G09F 9/30* (2006.01)
*G06F 1/16* (2006.01)
*H04M 1/02* (2006.01)

(52) U.S. Cl.
CPC ............ *G09F 9/301* (2013.01); *G06F 1/1652* (2013.01); *H04M 1/0216* (2013.01)

(58) Field of Classification Search
None
See application file for complete search history.

(56) References Cited

U.S. PATENT DOCUMENTS

| 10,662,305 | B2 | 5/2020 | Park et al. | |
|---|---|---|---|---|
| 2018/0118980 | A1* | 5/2018 | Robinson | ................ B32B 9/005 |
| 2020/0010736 | A1 | 1/2020 | Lee et al. | |
| 2021/0175471 | A1* | 6/2021 | Kim | ................... H10K 50/8445 |
| 2022/0389269 | A1* | 12/2022 | Yamaguchi | ........... C09D 151/08 |
| 2022/0404877 | A1* | 12/2022 | Sakamoto | ............. G06F 1/1656 |

FOREIGN PATENT DOCUMENTS

| CN | 111145646 A | * | 5/2020 | ............. G09F 9/301 |
|---|---|---|---|---|
| KR | 10-2058141 | | 12/2019 | |
| KR | 10-2095004 | | 3/2020 | |
| KR | 10-2020-0038179 | | 4/2020 | |
| WO | WO-2018030357 A1 | * | 2/2018 | ............. B65G 49/06 |

* cited by examiner

*Primary Examiner* — Phu Vu
(74) *Attorney, Agent, or Firm* — F. CHAU & ASSOCIATES, LLC

(57) ABSTRACT

A display module includes a display panel, a protective film, and an adhesive layer. The display panel includes a non-display area adjacent to a display area. The protective film is under the display panel, and the adhesive layer is between the display panel and the protective film. The protective film is or includes a polyethylene terephthalate film having a glass transition temperature equal to or greater than about 95° C.

20 Claims, 9 Drawing Sheets

DISPLAY MODULE AND ELECTRONIC APPARATUS HAVING THE SAME

CROSS-REFERENCE TO RELATED APPLICATION

This U.S. non-provisional patent application claims priority under 35 U.S.C. § 119 of Korean Patent Application No. 10-2020-0116555, filed on Sep. 11, 2020, the contents of which are hereby incorporated by reference in its entirety.

BACKGROUND

1. Field of Disclosure

One or more embodiments described herein relate to a display module and an electronic apparatus having the same.

2. Description of the Related Art

A variety of multimedia devices have been developed. Examples include mobile phones, notebook computers, tablet computers, navigation units, game units, and televisions. Efforts are currently being made to vary the shapes of these devices and to make their displays flexible, e.g., bendable, rollable or foldable.

SUMMARY

One or more embodiments described herein provide a display module having improved light transmittance in its display area and improved reliability.

In accordance with one or more embodiments, a display module includes a display panel comprising a display area and a non-display area adjacent to the display area, a protective film under the display panel and an adhesive layer between the display panel and the protective film. The protective film comprises a polyethylene terephthalate film having a glass transition temperature equal to or greater than about 95° C.

In an embodiment, the polyethylene terephthalate film may have a light transmittance equal to or greater than about 90% in a wavelength range from about 400 nm to about 700 nm.

In an embodiment, the polyethylene terephthalate film may have a thermal shrinkage rate equal to or less than about 0.2% at a temperature of about 150° C.

In an embodiment, the polyethylene terephthalate film may have a haze equal to or less than about 1%.

In an embodiment, the polyethylene terephthalate film has a modulus equal to or greater than about 4 GPa.

In an embodiment, the protective film further comprises a coating layer in contact with one surface of the polyethylene terephthalate film.

In an embodiment, the coating layer comprises an ion material having an anti-static function.

In an embodiment, the coating layer has a thickness equal to or greater than about 0.5 μm and equal to or less than about 2 μm.

In an embodiment, the adhesive layer comprises a pressure sensitive adhesive.

In an embodiment, the adhesive layer has a thickness equal to or greater than about 15 μm and equal to or less than about 18 μm.

In an embodiment, the display module further comprising a driving chip mounted on the display panel to overlap the non-display area.

In an embodiment, the display panel is configured to fold and unfold about a folding axis extending in one direction.

In accordance with one or more embodiments, an electronic apparatus includes a display panel, a window, a protective film, an adhesive layer, a support member, and an electronic module. The display panel includes a plurality of pixels, with the display panel configured to fold and unfold about a folding axis in one direction. The window is on the display panel. The protective film is under the display panel. The adhesive layer is between the display panel and the protective film. The support member is disposed under the protective film and provided with a hole defined therethrough to overlap the display panel, and the electronic module is in the hole. In addition, the protective film comprises a polyethylene terephthalate film having a glass transition temperature equal to or greater than about 95° C.

In an embodiment, the protective film further comprises a coating layer in contact with one surface of the polyethylene terephthalate film.

In an embodiment, the protective film has a haze equal to or less than about 0.4%.

In an embodiment, the protective film has a light transmittance equal to or greater than about 92% in a wavelength range from about 430 nm to about 700 nm.

In an embodiment, the electronic module comprises a camera module.

BRIEF DESCRIPTION OF THE DRAWINGS

The above and other features of the embodiments will become readily apparent by reference to the following detailed description when considered in conjunction with the accompanying drawings wherein.

DETAILED DESCRIPTION

Figure 1A:
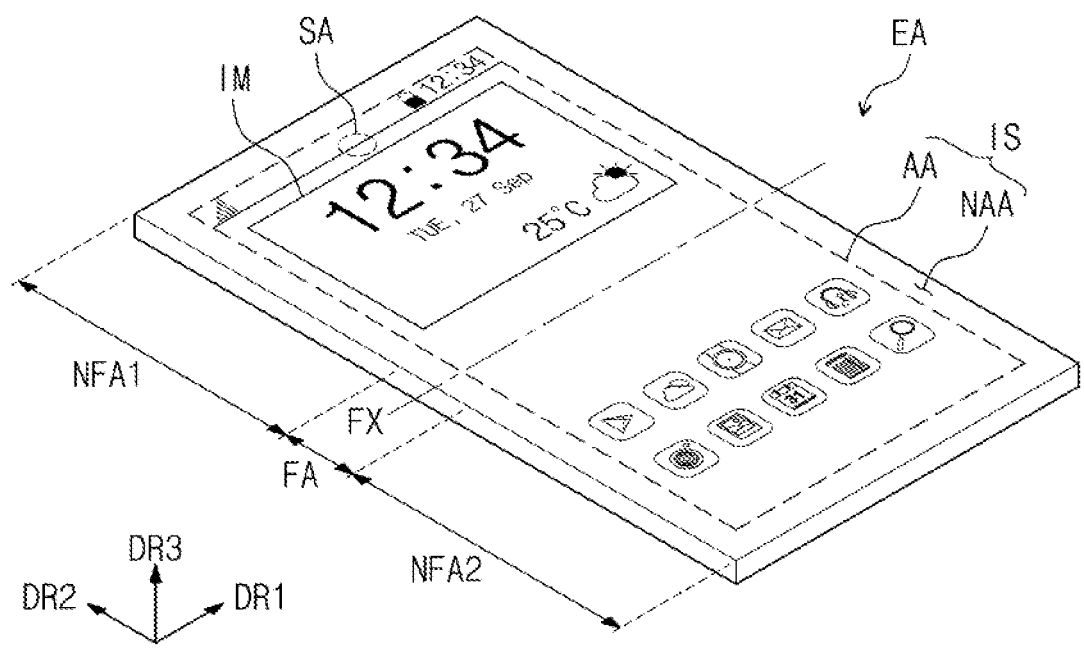
FIG. 1A illustrates an embodiment of an electronic apparatus.

The present disclosure may be variously modified and realized in many different forms, and thus specific embodiments will be exemplified in the drawings and described in detail herein below. However, the present disclosure should not be limited to the specific disclosed forms, and be construed to include all modifications, equivalents, or replacements included in the spirit and scope of the present disclosure.

In the present disclosure, it will be understood that when an element or layer is referred to as being "on", "connected to" or "coupled to" another element or layer, it can be directly on, connected or coupled to the other element or layer or intervening elements or layers may be present. Like numerals refer to like elements throughout. In the drawings, the thickness, ratio, and dimension of components are exaggerated for effective description of the technical content. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure. As used herein, the singular forms, "a", "an" and "the" are intended to include the plural forms as well, unless the context clearly indicates otherwise. Spatially relative terms, such as "beneath", "below", "lower", "above", "upper" and the like, may be used herein for ease of description to describe one element or feature's relationship to another element(s) or feature(s) as shown in the figures.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Figure 1B:
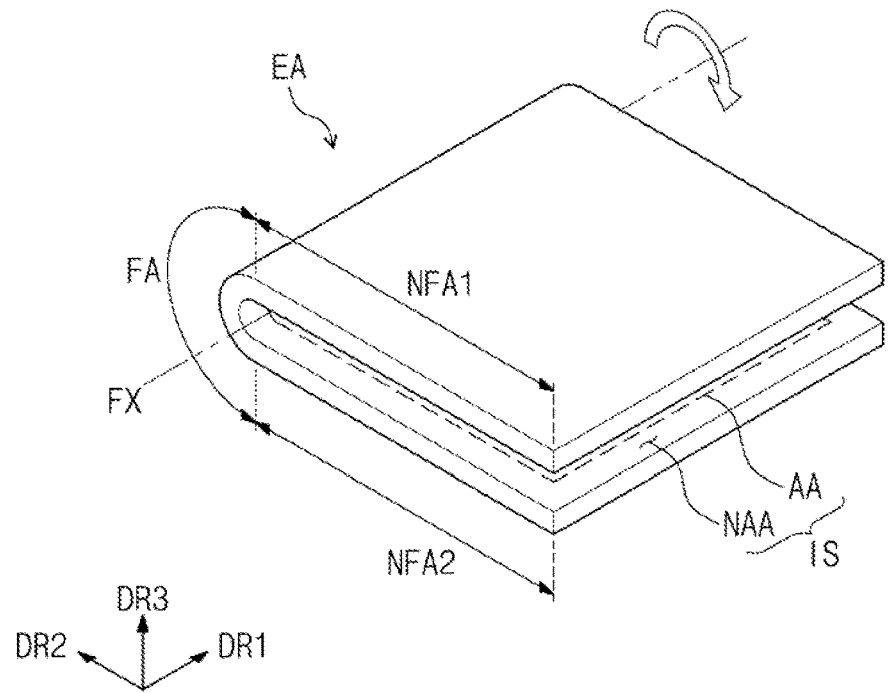
FIG. 1B illustrates the electronic apparatus in a folded state.
Figure 1C:
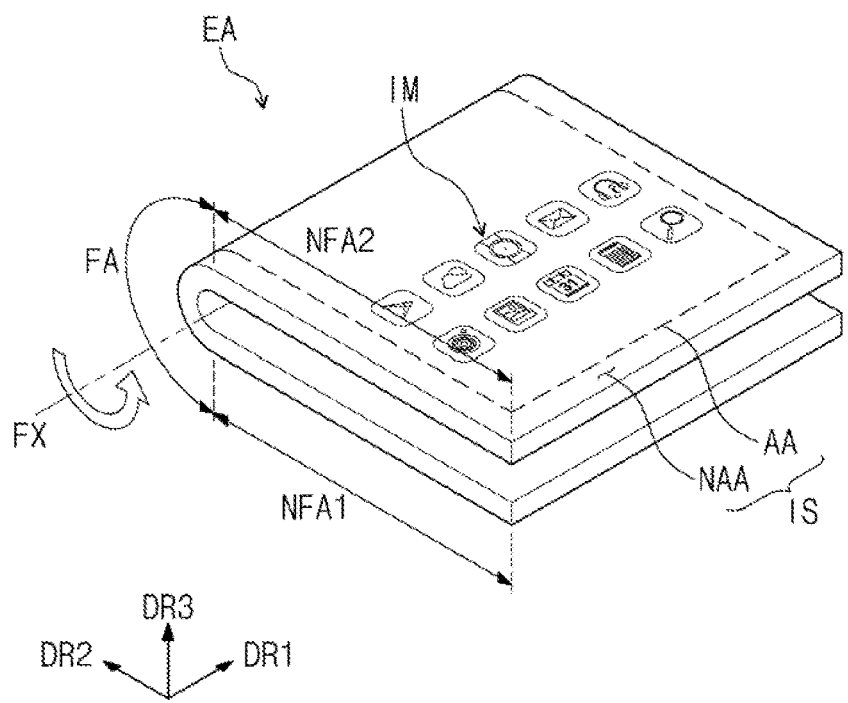
FIG. 1C illustrates the electronic apparatus in another folded state.

FIG. 1A is a perspective view showing an embodiment of an electronic apparatus, and FIGS. 1B and 1C are perspective views showing different folded states of the electronic apparatus shown in FIG. 1A.

The electronic apparatus EA may be activated in response to one or more electrical signals to display an image IM. The electronic apparatus EA may be, for example, a mobile phone, a notebook computer, a tablet computer, a navigation unit, a game unit, a television set, or the like, however, it should not be limited thereto. The electronic apparatus EA may be applied to other electronic items as long as they do not depart from the inventive concept of the present disclosure. A mobile phone is illustrated as an example in embodiments that follow.

Referring to FIG. 1A, the electronic apparatus EA may have, for example, a rectangular shape with short sides in a first direction DR1 and long sides in a second direction DR2 crossing the first direction DR1. An upper surface of the electronic apparatus EA may be a display surface IS, which, for example, may be substantially parallel to a plane indicated by the first direction DR1 and the second direction DR2. The electronic apparatus EA may have a different shape in another embodiment, including circular, elliptical, or another shape.

The display surface IS may include a display area AA and a non-display area NAA adjacent to the display area AA. The display area AA may display the image IM, and the non-display area NAA may not display the image IM. The image IM may be included in video or may be a still image. FIGS. 1A and 1C show application icons as a representative example of the image IM.

The display area AA may have a predetermined shape, e.g., a quadrangular shape. The non-display area NAA may surround the display area AA, however, it should not be limited thereto. The display area AA and the non-display area NAA may have different shapes in one embodiment. Also, the non-display area NAA may completely surround the display area AA or may partially surround the display area AA, e.g., adjacent to only one or more sides of the display area AA, or may be omitted altogether.

The display area AA may include a sensing area SA of the electronic apparatus EA. FIG. 1A shows one sensing area SA, however a plurality of sensing areas may be included in another embodiment. The sensing area SA may be a portion of the display area AA, and the image IM may be displayed through the sensing area SA.

Meanwhile, upper (or front) and lower (or rear) surfaces of each member may be provided with respect to the direction in which the image IM is displayed. The upper and lower surfaces may be opposite to each other in a third direction DR3, and a normal line direction of each of the upper and lower surfaces may be substantially parallel to the third direction DR3. Directions indicated by the first, second, and third directions DR1, DR2, and DR3 may be relative to each other and may be changed to other directions. Hereinafter, the first, second, and third directions DR1, DR2, and DR3 are respectively assigned the same reference numerals.

The electronic apparatus EA may be flexible, e.g., the electronic apparatus EA may have flexible properties that allow the electronic apparatus EA to be fully bent or bent a predetermined distance, e.g., measured on a scale of a few nanometers. For example, the electronic apparatus EA may be a curved electronic apparatus or a foldable electronic apparatus. However, it should not be limited thereto, and the electronic apparatus EA may be rigid according to other embodiments.

As shown in FIGS. 1A to 1C, according to an embodiment the electronic apparatus EA may be folded or unfolded about a folding axis FX extending in one direction. The electronic apparatus EA may be inwardly folded (in-folding) or outwardly folded (out-folding) about the folding axis FX. FIG. 1A shows an embodiment of electronic apparatus EA in an unfolded state, FIG. 1B shows an inwardly folded (in-folding) state of the electronic apparatus EA, and FIG. 1C shows an outwardly folded (out-folding) state of the electronic apparatus EA.

The folding axis FX may extend along one direction of the electronic apparatus EA. For example, the folding axis FX may correspond to an axis substantially parallel to the short sides of the electronic apparatus EA as shown in FIGS. 1A to 1C. However, it should not be limited thereto, and the folding axis may correspond to an axis substantially parallel to the long sides of the electronic apparatus EA.

The electronic apparatus EA may include a folding area FA in which a change in shape occurs with respect to the folding axis FX. In this case, non-folding areas NFA1 and NFA2 may be adjacent to respective sides of the folding area FA, such that the folding area FA is between the non-folding areas NFA1 and NFA2. Referring to FIG. 1A, the electronic apparatus EA may include a first non-folding area NFA1 adjacent to one side of the folding area FA (which is substantially parallel to the folding axis FX) and a second non-folding area NFA2 adjacent to the other side of the folding area FA (which is substantially parallel to the folding axis FX). FIGS. 1A to 1C show one folding area FA, but a plurality of folding areas may be included in another embodiment.

Referring to FIG. 1B, the electronic apparatus EA may be inwardly folded (in-folding) about the folding axis FX. When the electronic apparatus EA is inwardly folded (in-folding), the display surface IS of the first non-folding area NFA1 and the display surface IS of the second non-folding area NFA2 may face each other. Accordingly, a rear surface of the electronic apparatus EA (which is opposite to the display surface IS of the electronic apparatus EA) may be exposed outside, and the display surface IS of the electronic apparatus EA may be protected from external impact.

Referring to FIG. 1C, the electronic apparatus EA may be outwardly folded (out-folding) about the folding axis FX. When the electronic apparatus EA is outwardly folded, the rear surface corresponding to the first non-folding area NFA1 and the rear surface corresponding to the second non-folding area NFA2 may face each other. Also, the display surface IS may be exposed in an outside direction the electronic apparatus EA. Accordingly, a user may view the image IM through the display surface IS exposed to the outside of the electronic apparatus EA that is outwardly folded.

Figure 2:
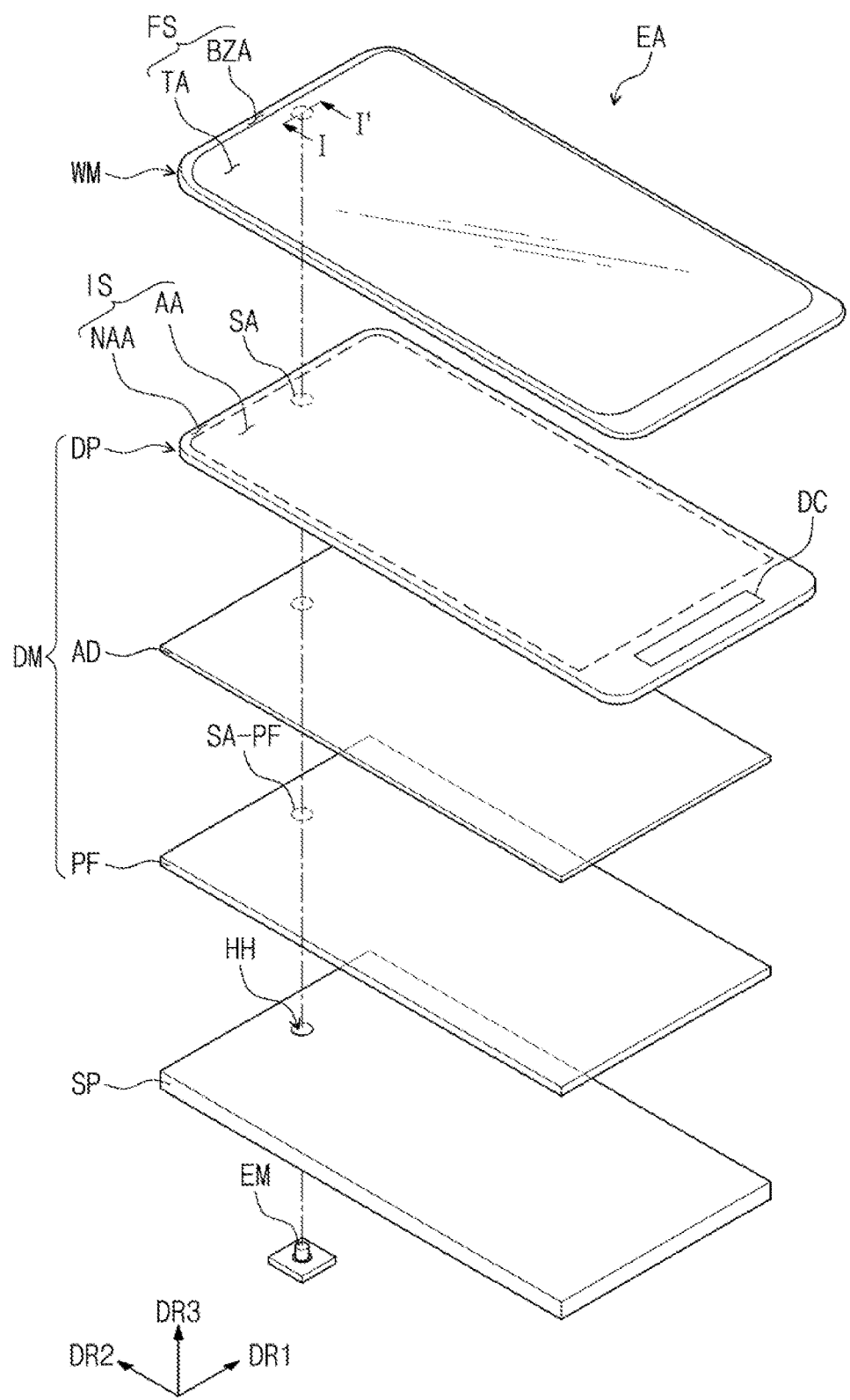
FIG. 2 illustrates an exploded perspective view of an embodiment of an electronic apparatus.

FIG. 2 is an exploded perspective view showing an embodiment of the electronic apparatus EA, which may include a window WM, a display module DM, a support member SP, and an electronic module EM. The display module DM may include a display panel DP, an adhesive layer AD, and a protective film PF. The display module DM may generate images and may provide the images to the user.

The display panel DP may be a light-emitting-type display panel, for example, the display panel DP may be a liquid crystal display panel, an organic light emitting display panel, or a quantum dot light emitting display panel. However, it should not be limited thereto. The display panel DP may include a display area AA through which the image IM (e.g., refer to FIG. 1A) is displayed and a non-display area NAA adjacent to the display area AA. The display panel DP may include a plurality of pixels arranged in an area corresponding to the display area AA. A driving circuit, a driving line, or a signal line providing electrical signals may be arranged in an area corresponding to the non-display area NAA of the display panel DP. The display panel DP may include a sensing area SA defined within the display area AA.

As shown in FIG. 2, the display module DM may further include a driving chip DC, which may be mounted on the display panel DP to overlap the non-display area NAA. The driving chip DC may apply electrical signals to the pixels in the display panel DP. For example, the driving chip DC may generate driving signals for operation of the display panel DP based on control signals applied thereto from an external source. The driving chip DC may apply signals to control the pixels. The pixels may generate images in response to the electrical signals applied thereto by the driving chip DC, and the electronic apparatus EA may provide the images through the display area AA.

The protective film PF may be under the display panel DP and may protect the display panel DP from external impact. In addition, the protective film PF may prevent scratches from occurring on a rear surface of the display panel DP when the display panel DP is manufactured. The protective film PF may be a flexible film, which, for example, may not be cracked even when the electronic apparatus EA is repeatedly folded and unfolded. The protective film PF may have a predetermined transmittance, e.g., a high light transmittance that is above a predetermined value. In one embodiment, the protective film PF may include a polyethylene terephthalate (PET) film, but may include one or more films of other materials in a different embodiment.

The adhesive layer AD may be between the display panel DP and the protective film PF. The adhesive layer AD may be in contact with the rear surface of the display panel DP and a front surface of the protective film PF, and thus may attach the protective film PF to the rear surface of the display panel DP.

In one embodiment, the adhesive layer AD may include a pressure sensitive adhesive. Examples include an acrylic-based compound or a silicone-based compound. The acrylic-based compound may include, for example, butyl acrylate, ethyl acrylate, acrylic acid, or a mixture thereof. The adhesive layer AD may include a different material in another embodiment. The adhesive layer AD may have a thickness equal to or greater than about 15 µm and equal to or smaller than about 18 µm. When the thickness of the adhesive layer AD is small (e.g., less than a predetermined value), the display panel DP may be damaged due to the repetitive folding and unfolding operations. When the thickness of the adhesive layer AD is large (e.g., greater than another predetermined value), stress applied to the display panel DP may increase in a process of mounting the driving chip DC on the display panel DP.

The window WM may be on the display module DM and may protect the display module DM from external impact or scratches. The window WM may cover a front surface of the display panel DP. The window WM may include an upper surface FS exposed to the outside. The upper surface of the electronic apparatus EA may correspond to the upper surface FS of the window WM.

The upper surface FS of the window WM may include a transmission area TA and a bezel area BZA adjacent to the transmission area TA. The transmission area TA of the window WM may be an optically transparent area and, for example, may have a shape corresponding to the display area AA of the display panel DP. For example, the transmission area TA may overlap an entire surface or at least a portion of the display area AA of the display panel DP. Images displayed through the display area AA of the display panel DP may be viewed from the outside through the transmission area TA.

The bezel area BZA of the window WM may be adjacent to the transmission area TA, and the shape of the transmission area TA may be based on the bezel area BZA. As an example, the bezel area BZA may surround the transmission area TA, may be adjacent to only one or more (but not all) sides of the transmission area TA, or may be omitted altogether. The bezel area BZA may cover the non-display area NAA of the display panel DP to prevent the non-display area NAA from being viewed from the outside.

The window WM may include an optically transparent insulating material. Examples include a polymer film, a plastic substrate, a thin glass, etc. The window WM may have a single-layer or multi-layer structure. Various functional layers, such as an anti-reflective layer, an anti-fingerprint layer, a phase control layer, etc., may be disposed on the window WM.

The support member SP may be under the display module DM and may be in contact with a lower surface of the protective film PF. The support member SP may absorb the external impact and may prevent the display module DM from being deformed. In one embodiment, the support member SP may be provided with a hole HH therethrough. The hole HH may be formed through the support member SP, and the hole HH of the support member SP may overlap the electronic module EM.

The electronic module EM may be under the display module DM. At least a portion of the electronic module EM may be inserted into and disposed in the hole HH. The electronic module EM may be an electronic component that outputs or receives optical signals. For example, the electronic module EM may be a camera module that photographs an image of an external object or a sensor module such as a proximity sensor or an infrared ray emission sensor.

The hole HH may have a variety of shapes. In FIG. 2, the hole HH has a circular shape, but may have a different shape in another embodiment. Examples include an oval shape, a quadrangular shape, or a shape including curved and straight sides.

The hole HH may overlap the display area AA of the display panel DP and may correspond to the sensing area SA within the display area AA. The electronic module EM disposed in the hole HH may overlap the sensing area SA of the display panel DP when viewed in a plane. In one embodiment, a hole may not be formed through the display panel DP corresponding to the sensing area SA, and thus images may be provided to the outside through the sensing area SA.

The hole HH may overlap the transmission area TA of the window WM, the sensing area SA of the display panel DP, and a partial area SA-PF of the protective film PF when viewed in a plane. The partial area SA-PF of the protective film PF may have a high light transmittance value. The external light may be provided to the electronic module EM through the hole HH, after passing through the partial area SA-PF of the protective film PF. The electronic module EM may output the optical signal through the partial area SA-PF of the protective film PF.

The electronic apparatus EA may further include a functional layer between the display panel DP and the window WM. For example, the functional layer may be an anti-reflective layer or an input sensing layer, however, it should not be limited thereto. The functional layer may have a multi-layer structure in which the anti-reflective layer is stacked on the input sensing layer.

The input sensing layer may include a plurality of insulating layers and a plurality of conductive layers. The conductive layers may form a sensing electrode that senses external inputs, a sensing line connected to the sensing electrode, and a sensing pad connected to the sensing line. The anti-reflective layer may be a functional layer to reduce a reflectance of the external light and to prevent a color mixture. The anti-reflective layer may include color filters having a predetermined arrangement or a destructive interference structure.

The electronic apparatus EA may include a housing that accommodates the display module DM, the support member SP, and the electronic module EM. The housing may be coupled to the window WM to form an appearance of the electronic apparatus EA.

Figure 3:
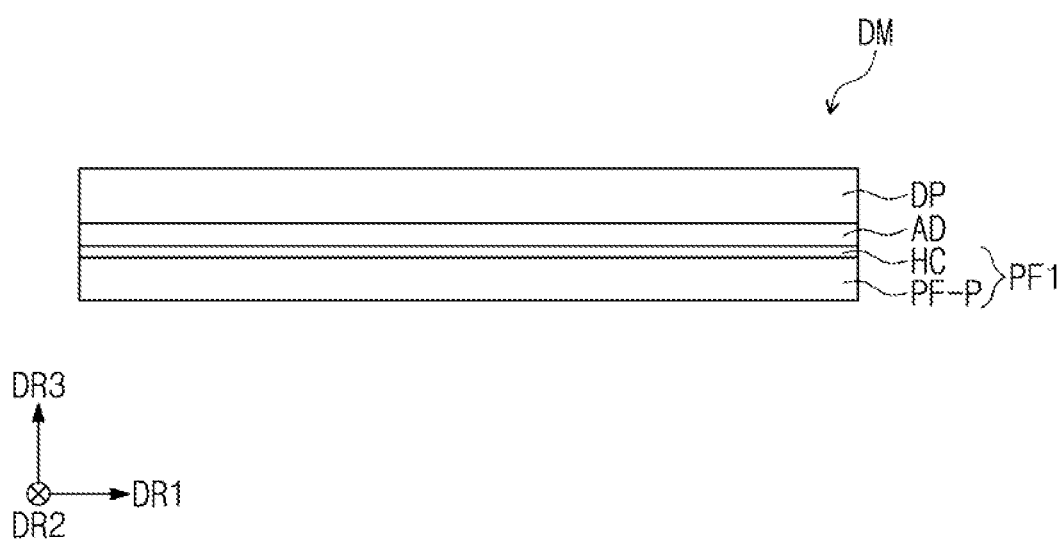
FIG. 3 illustrates a cross-sectional view of an embodiment of a display module.

FIG. 3 is a cross-sectional view of an embodiment of the display module DM, which may include a protective film PF1, an adhesive layer AD, and a display panel DP, which are sequentially stacked in the third direction DR3. The protective film PF1 may include a PET film PF-P and a coating layer HC. The coating layer HC may be in contact with one surface of the PET film PF-P. FIG. 3 shows a structure in which the coating layer HC is in contact with an upper surface of the PET film PF-P, however, the present disclosure should not be limited thereto. In one example, the coating layer HC may be in contact with a lower surface of the PET film PF-P.

The PET film PF-P may have a predetermined (e.g., superior) light transmittance, e.g., one that exceeds a predetermined elevated level. Referring to FIG. 2, a partial area of the PET film PF-P may overlap the electronic module EM, and an optical signal applied to the electronic module EM or an optical signal output from the electronic module EM may transmit through the PET film PF-P. Because the PET film PF-P has the superior light transmittance, the optical signal applied to or output from the electronic module EM may be easily transmit through the PET film PF-P. According to an embodiment, the light transmittance of the PET film PF-P may be equal to or greater than about 90% in a visible light range. For example, the light transmittance of the PET film PF-P in a wavelength range from about 400 nm to about 700 nm may be equal to or greater than about 90%.

According to an embodiment, the PET film PF-P may have a relatively low haze, e.g., below a predetermined level. For example, the haze of the PET film PF-P may be equal to or less than about 1.2%, and in one embodiment may be equal to or less than about 1.0%. In one embodiment, haze may correspond to a value obtained by Equation 1.

$$Td/(Tp+Td) \qquad (1)$$

where Tp denotes the light transmittance in a direction in which the light is incident, and Td denotes the light transmittance in a direction in which the light is diffused, which is different from the incident direction of the light. As haze increases, light transmittance in the incident direction of the light decreases, and thus efficiency in receiving or outputting light decreases.

According to an embodiment, the PET film PF-P may be a film from which an oligomer contained therein is removed through a specific-heat treatment. Oligomer may correspond to a compound in which, for example, several to tens of monomers are polymerized. An oligomer having a relatively low molecular weight, compared to a polymer, may have a low specific heat value. To this end, a specific-heat treatment may refer to a process of providing heat with a temperature approximating the specific heat of the oligomer to the protective film PF1. The oligomer of the protective film PF1 provided with the specific-heat treatment may be removed due to a difference in specific heat.

The PET film PF-P from which the oligomer is removed may have a glass transition temperature higher than that of a PET film from which an oligomer is not removed. Glass transition temperature may refer to a temperature at which molecules of a polymer material start to actively move due to the provided heat. The oligomer, which has a relatively low molecular weight compared to the polymer, may actively move at a lower temperature compared with the polymer. Accordingly, as the proportion of the oligomer in PET film decreases, the glass transition temperature of the PET film may increase.

According to an embodiment, the glass transition temperature of the PET film PF-P may be equal to or greater than about 95° C. The glass transition temperature of the PET film PF-P may be higher than the glass transition temperature of the PET film from which the oligomer is not removed, for example, by a range from about 9° C. to about 10° C. As the glass transition temperature of the PET film PF-P decreases, the electronic apparatus EA including the PET film may undergo plastic deformation at a rapid rate in a reliability evaluation under high temperature/high humidity conditions, and the PET film may be permanently deformed. As the glass transition temperature of the PET film PF-P increases, reliability of the electronic apparatus EA including the PET film may be improved because deformation of the PET film does not occur easily, even in a high temperature/high humidity environment.

According to the embodiment, the PET film PF-P may have an improved thermal shrinkage rate. For example, the thermal shrinkage rate of the PET film PF-P may be equal to or less than about 0.2%. In one embodiment, the thermal shrinkage rate of the PET film PF-P may be equal to or less than about 0.3% in each of longitudinal and transverse directions.

The flexible film has a tendency to shrink in a direction opposite to a stretched direction thereof when heat is applied thereto. The flexible film may undergo a heat-set process in a film manufacturing process to reduce a degree of the thermal shrinkage of the flexible film.

In the PET film from which the oligomer is not removed, the oligomer may move to a surface of the PET film during the heat-set process of the film. Accordingly, the PET film may turn white, r the surface of the PET film may become uneven. As a result, light transmittance of the PET film may decrease or haze may increase. For the PET film PF-P from which the oligomer is removed, the PET film PF-P may undergo the heat-set process to reduce the thermal shrinkage rate without degrading light transmittance of the PET film PF-P.

Accordingly, according to an embodiment the PET film PF-P may have a relatively high light transmittance and a relatively low haze compared with other types of PET films and may have a strong resistance to the deformation caused by the heat. For example, since the oligomer moving to the surface of the film due to the heat is removed, thermal properties of the PET film PF-P may be improved without degrading optical properties of the PET film PF-P, such as light transmittance and haze.

According to an embodiment, the PET film PF-P may have an improved modulus. For example, the modulus of the PET film PF-P may be equal to or greater than about 4 Gpa. As the proportion of the polymer with a high molecular weight to the oligomer with a low molecular weight in the PET film PF-P increases, the property of the film to resist the deformation due to an external force may become stronger. Accordingly, when the modulus of the PET film PF-P is improved, the PET film PF-P may not be easily deformed even though the PET film PF-P is repeatedly folded or unfolded. Also, the PET film PF-P may not be easily damaged, even when pressure is applied to the PET film PF-P in the manufacturing process of the display module.

The coating layer HC may be in contact with the one surface of the PET film PF-P. Because the coating layer HC is on the one surface of the PET film PF-P, one surface of the protective film PF1 may be flat. Therefore, the protective film PF1 including the coating layer HC may have a smooth surface.

As the surface of the protective film PF1 becomes smoother, the light transmittance of the protective film PF1 may increase. The light transmittance of the protective film PF1 including the coating layer HC may be equal to or greater than about 92% in the visible light range. For example, the light transmittance of the protective film PF1 may be equal to or greater than about 92% in the wavelength range from about 430 nm to about 700 nm.

As the surface of the protective film PF1 becomes smoother, the haze of the protective film PF1 may be improved. In one embodiment, the haze of the protective film PF1 including the coating layer HC may, for example, be equal to or smaller than about 0.4%.

The coating layer HC may have a thickness equal to or less than about 3 µm. For example, the thickness of the coating layer HC may be equal to or greater than about 0.5 and equal to or less than about 2 µm. When the thickness of the coating layer HC is relatively large (e.g., above a predetermined value), the coating layer HC in the display module DM may cracked by repetitive folding and unfolding operations of the display module DM.

The coating layer HC may have an anti-static function, and, for example, may include an ion material for the anti-static function. The coating layer HC may be formed, for example, by mixing the ion material with a resin in a process of forming the coating layer HC. Since the coating layer HC has the anti-static function, the coating layer HC may prevent the display panel DP on the coating layer HC from being affected by static electricity. Accordingly, according to an embodiment, the coating layer HC may improve the light transmittance and haze of the protective film PF1 and may also have the anti-static function. In addition, the light transmittance of the protective film may be lowered by disposing a separate anti-static layer on the coating layer HC, but the coating layer HC of the embodiment may prevent the light transmittance of the protective film PF from being lowered.

In FIG. 3, the display module DM is shown to include the coating layer HC as a representative example. The coating layer HC may be in a different location or may be omitted in another embodiment.

Figure 4:
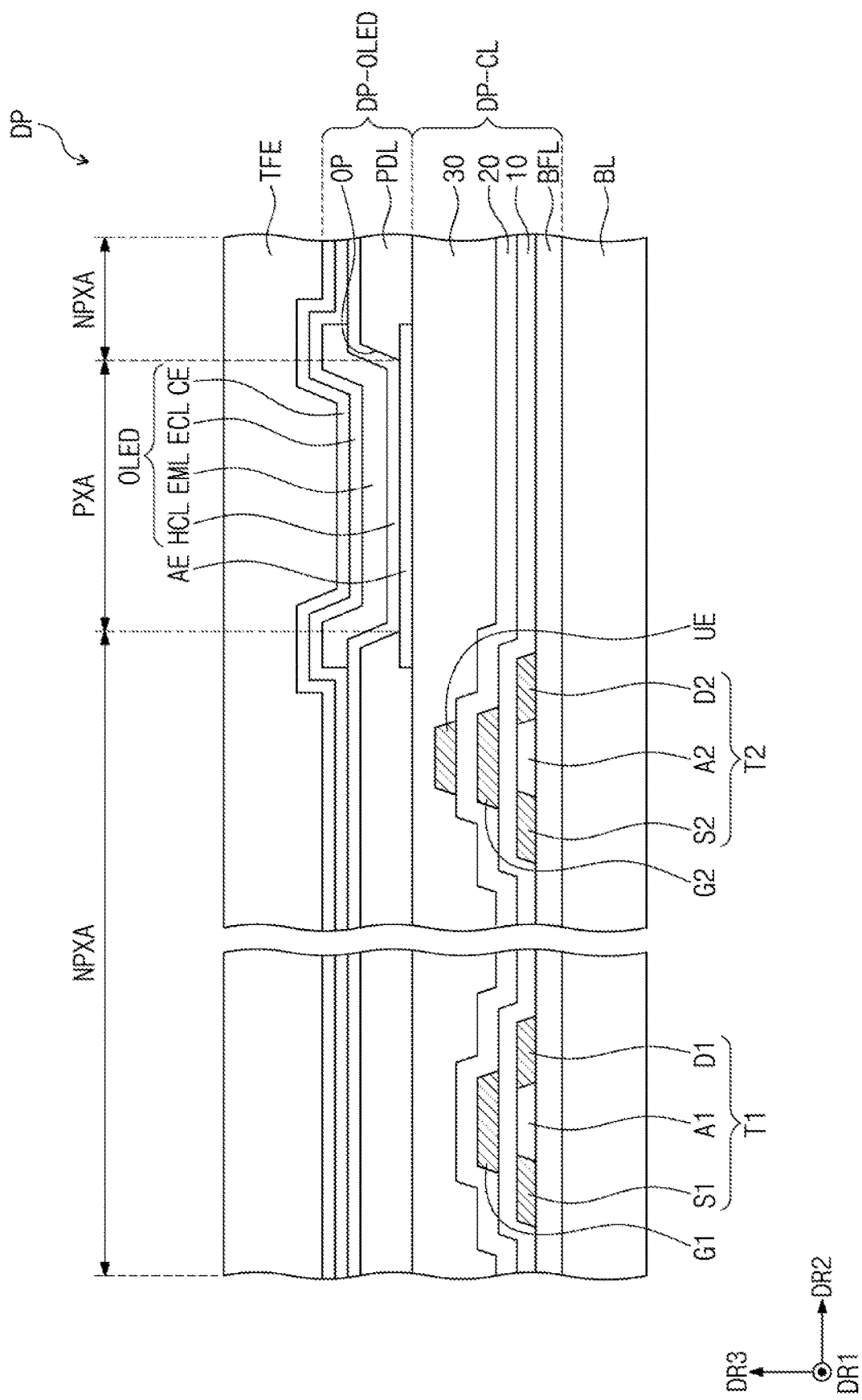
FIG. 4 illustrates a cross-sectional view of an embodiment of a display panel.

FIG. 4 is a cross-sectional view showing an embodiment of display panel DP, which may include a base layer BL, a circuit layer DP-CL, a light emitting element layer DP-OLED, and an encapsulation layer TFE sequentially stacked in the third direction DR3.

The base layer BL may include a synthetic resin layer, e.g., at least one of a polyimide-based resin, an acrylic-based resin, a methacrylic-based resin, a polyisoprene-based resin, a vinyl-based resin, an epoxy-based resin, a urethane-based resin, a cellulose-based resin, a siloxane-based resin, or a perylene-based resin. In one embodiment, the base layer BL may include a glass substrate, a metal substrate, or an organic/inorganic composite material substrate. The protective film PF1 may be attached to a lower surface of the base layer BL by the adhesive layer AD (e.g., refer to FIG. 3).

The circuit layer DP-CL may be on the base layer BL and may include at least one insulating layer and a circuit element. The circuit element may include a signal line and a pixel driving circuit. The circuit layer DP-CL may be formed, for example, by a coating or depositing process to form an insulating layer, a semiconductor layer, and a conductive layer and several photolithography processes to pattern the insulating layer, the semiconductor layer, and the conductive layer.

In one embodiment, the circuit layer DP-CL may include a buffer layer BFL, a plurality of insulating layers 10, 20, and 30, and a plurality of transistors TR1 and TR2. The buffer layer BFL may be on the base layer BL and, for example, may be formed on an upper surface of the base layer BL. The buffer BFL layer may include at least one inorganic layer. The inorganic layer may, for example, include at least one of aluminum oxide, titanium oxide, silicon oxide, silicon oxynitride, zirconium oxide, or hafnium oxide. In one embodiment, the buffer layer BFL may have a multi-layer structure in which a silicon oxide layer and a silicon nitride layer are alternately stacked one on another, however the material for the buffer layer BFL may be different in another embodiment.

A semiconductor pattern may be on the buffer layer BFL and may increase adhesion between the base layer BL and the semiconductor pattern. The semiconductor pattern may include, for example, polysilicon, amorphous silicon, or metal oxide, or another material. In FIG. 4, a portion of the semiconductor pattern is shown disposed on the buffer layer BFL.

As shown in FIG. 4, a source S1, an active A1, and a drain D1 of a first transistor T1 and a source S2, an active A2, and a drain D2 of a second transistor T2 may be formed from the semiconductor pattern. The sources S1 and S2 and the drains D1 and D2 may extend in opposite directions to each other from the actives A1 and A2 when viewed in a cross-section.

A first insulating layer 10 may be on the buffer layer BFL and may cover the semiconductor pattern. The first insulating layer 10 may be an inorganic layer and/or an organic layer and may have a single-layer or multi-layer structure.

Gates G1 and G2 may be on the first insulating layer 10 and may be portions of metal patterns. The gates G1 and G2 may overlap the actives A1 and A2, respectively.

A second insulating layer 20 may be on the first insulating layer 10 to cover the gates G1 and G2. The second insulating layer 20 may be an inorganic layer and/or an organic layer and may have a single-layer or multi-layer structure.

An upper electrode UE may be on the second insulating layer 20 and may overlap the gate G2 of the second transistor T2. The upper electrode UE may be a portion of a metal pattern. A portion of the gate G2 and the upper electrode UE overlapping the portion of the gate G2 may form a capacitor. In one embodiment, the upper electrode UE may be omitted.

A third insulating layer 30 may be on the second insulating layer 20 to cover the upper electrode UE. The third insulating layer 30 may be an inorganic layer and/or an organic layer and may have a single-layer or multi-layer structure.

Each of the first insulating layer 10, the second insulating layer 20, and the third insulating layer 30 may, for example, include at least one of aluminum oxide, titanium oxide, silicon oxide, silicon oxynitride, zirconium oxide, or hafnium oxide. However, materials for one or more of the first insulating layer 10, the second insulating layer 20, or the third insulating layer 30 may be different in another embodiment.

The light emitting element layer DP-OLED may be on the circuit layer DP-CL and may include a light emitting element OLED and a pixel definition layer PDL. The pixel definition layer PDL may be provided with an opening OP defined therethrough.

The light emitting element OLED may include a first electrode AE, a hole control layer HCL, a light emitting layer EML, an electron control layer ECL, and a second electrode CE. The light emitting element OLED may be in the opening OP of the pixel definition layer PDL. The light emitting layer EML may be between the first electrode AE and the second electrode CE, and may be activated according to a difference in electric potential between the first electrode AE and the second electrode CE and may generate a light.

The hole control layer HCL may include at least one of a hole transport layer or a hole injection layer. The electron control layer ECL may include at least one of an electron transport layer or an electron injection layer.

The display area AA (e.g., refer to FIG. 2) may include a light emitting area PXA and a non-light-emitting area NPXA adjacent to the light emitting area PXA. The non-light-emitting area NPXA may surround the light emitting area PXA. The light emitting area PXA may correspond to an area in which the light emitting layer EML is disposed, and the light emitting layer EML may be disposed in each pixel after being divided into a plurality of portions. The non-light-emitting area NPXA may correspond to an area in which the pixel definition layer PDL is disposed.

The encapsulation layer TFE may be on the light emitting element layer DP-OLED and may encapsulate the light emitting element layer DP-OLED. The encapsulation layer TFE may include at least one insulating layer. In one embodiment, the encapsulation layer TFE may include at least one organic layer and at least one inorganic layer.

The inorganic layer may protect the light emitting element layer DP-OLED from moisture and oxygen, and the organic layer may protect the light emitting element layer DP-OLED from a foreign substance such as dust particles. For example, the inorganic layer may include a silicon nitride layer, a silicon oxynitride layer, a silicon oxide layer, a titanium oxide layer, an aluminum oxide layer, or a layer of another material. The organic layer may include an acrylic-based organic layer or a layer of another material.

Figure 5:
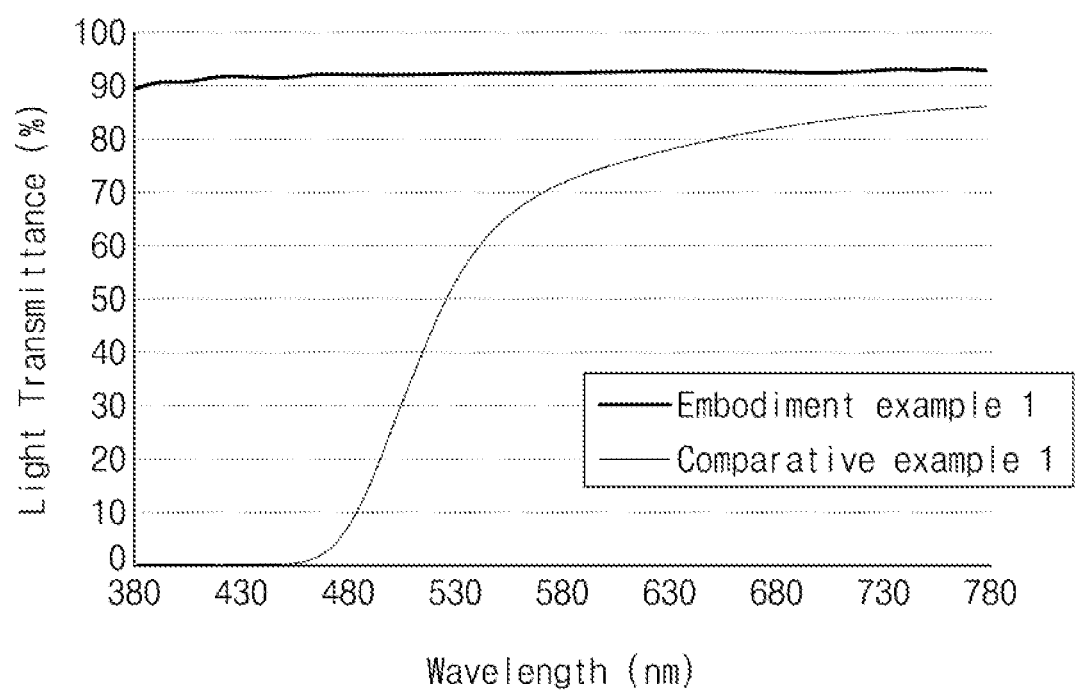
FIG. 5 illustrates a graph of light transmittance as a function of wavelength for an embodiment and a comparative example.
Figure 6:
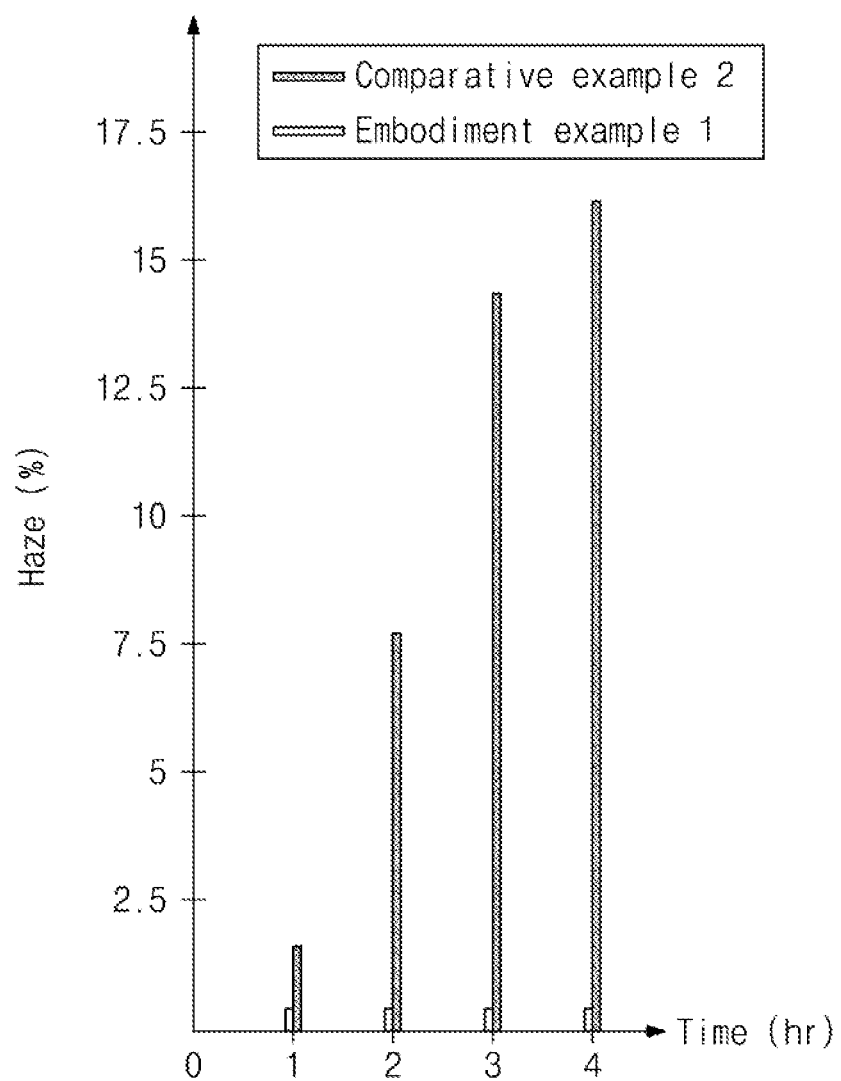
FIG. 6 illustrates a graph of haze as a function of time for an embodiment and a comparative example.
Figure 7:
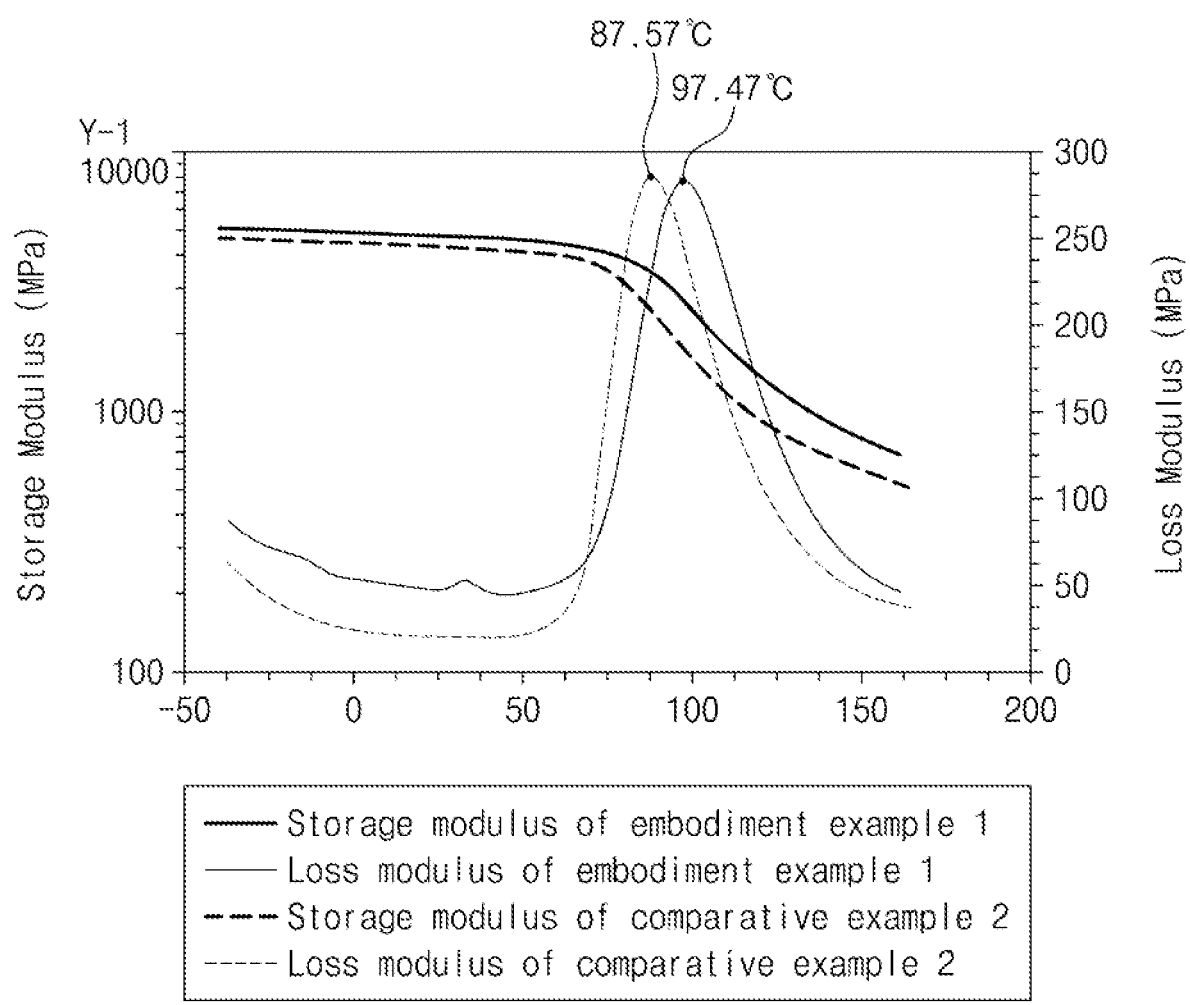
FIG. 7 illustrates a graph of a storage modulus and a loss modulus as a function of temperature for an embodiment and a comparative example.

FIG. 5 is a graph showing light transmittance as a function of wavelength of embodiment example 1 and comparative example 1. FIG. 6 is a graph showing haze as a function of time of embodiment example 1 and comparative example 2. FIG. 7 is a graph showing a storage modulus and a loss modulus as a function of a temperature of embodiment example 1 and comparative example 2.

Embodiment example 1 corresponds to the PET film PF-P from which the oligomer is removed and on which the coating layer HC is disposed, like the configuration of the protective film PF1 shown in FIG. 3. Comparative example 1 corresponds to a polyimide (PI) film, and comparative example 2 corresponds to the PET film from which the oligomer is not removed.

Referring to FIG. 5, embodiment example 1 may have the light transmittance equal to or greater than about 90% in the wavelength range from about 400 nm to about 700 nm. Comparative example 1 may have an average light transmittance of about 56% in the wavelength range from about 400 nm to about 700 nm. The PI film that is comparative example 1 may have a yellow color, and particularly may have a very low light transmittance in the wavelength range from about 400 nm to about 500 nm, which corresponds to a blue light wavelength range.

The light transmittance of the protective film PF on the electronic module EM (e.g., refer to FIG. 9) may affect the reception and output of optical signals of the electronic module EM. Accordingly, as the protective film PF including the PET film PF-P having the improved light transmittance compared with the PI film is disposed on the electronic module EM, the electronic module EM may effectively receive or output the optical signals.

The graph shown in FIG. 6 shows variation in haze of the film according to time of embodiment example 1 and comparative example 2. It is observed that the haze of embodiment example 1 (which is the PET film from which the oligomer is removed) is maintained substantially equal to or less than about 0.4% for 4 hours through the graph shown in FIG. 6. However, it is observed that the haze of comparative example 2 (which is the PET film from which the oligomer is not removed) gradually increases for 4 hours. For example, the haze of comparative example 2 has values of about 1.5%, about 7.6%, about 14.4%, and about 16.3% when measured at every one hour. Also, it is observed that the haze of comparative example 2 increases by about 1.1%, about 7.2%, about 14.0%, and about 15.9% when compared with the haze of embodiment example 1.

Comparative example 2 includes the same material as embodiment example 1 and does not undergo the oligomer removing process and has a higher proportion of oligomer included in the film compared with embodiment example 1. Accordingly, when comparative example 2 is exposed to high temperature, the oligomer moves to the surface of the film, uneven portions of the surface of the film increase, and the haze of the film increases. In addition, as the exposure time to heat increases, the haze of the film having the higher proportion of oligomer gradually increases.

Therefore, according to an embodiment the protective film including the PET film may maintain improved optical properties, even when exposed to high temperature environments. In addition, according to an embodiment the electronic apparatus including the protective film may maintain reliability under high temperature and high humidity environments.

Through the graph shown in FIG. 7, it is observed that the storage modulus of embodiment example 1 and comparative example 2 has a tendency to gradually decrease above a certain temperature, and the loss modulus of embodiment example 1 and comparative example 2 has a tendency to increase and then decrease following a parabolic curve in a specific temperature range.

When heat is applied to the film, the storage modulus of the film may decrease and plastic deformation may occur. Meanwhile, the film in which plastic deformation occurs due to external force may not return to its original state and may be permanently deformed even though the external force is removed. The temperature at which plastic deformation of the film occurs may be predicted, and the thermal properties of the film may be evaluated based on the temperature at which the storage modulus begins to decrease.

Referring to FIG. 7, the temperature at which the storage modulus of embodiment example 1 begins to decrease is higher than the temperature at which the storage modulus of comparative example 2 begins to decrease. Thus, the degree of deformation of the film is less in embodiment example 1 compared with comparative example 2 when the same heat is applied. Accordingly, the temperature at which the plastic deformation of the film begins to occur in embodiment example 1 may be higher than that in comparative example 2.

The temperature at which the loss modulus value of the film is largest corresponds to the glass transition temperature of the film. Referring to FIG. 7, the glass transition temperature of embodiment example 1 is about 97.47° C., which is higher than the glass transition temperature of comparative example 2, which is about 87.57° C., by about 9.90° C. As a result, embodiment example 1 has a smaller proportion of oligomer than comparative example 2, and the film may be heated at a higher temperature to activate movement of molecules in the film.

According to an embodiment, the degree of deformation by the heat of the protective film including the PET film may be reduced, and thus the glass transition temperature of the film may increase. Reducing the degree of deformation the protective film under the high temperature may improve the reliability of the electronic apparatus when operating in a high temperature environment.

Table 1 shows a comparison of property values between comparative example 1, comparative example 2, and embodiment example 1. Here, "light transmittance" may correspond to a degree of transmittance of incident light in a wavelength range from about 400 nm to about 700 nm. Also, "haze" may correspond to a proportion of the light transmittance diffused in a direction different from the light incident direction among total light transmittance values. Also, "transverse modulus" may correspond to a modulus with respect to a force applied to the transverse direction, and "longitudinal modulus" may indicate a modulus with respect to a force applied to the longitudinal direction. In addition, "compressive strain" may correspond to the degree of deformation of the film when the film is compressed by a force of, for example, about 10N, "glass transition temperature" may indicate a temperature at which a polymer material in the film starts to move actively, and "thermal shrinkage rate" may correspond to a degree of deformation of the film when the film is left at a temperature of, for example, about 150° C. for about 30 minutes.

Embodiment example 1 is the PET film PF-P from which the oligomer is removed and on which the coating layer HC is disposed, as shown in FIG. 3. Comparative example 1 is the polyimide (PI) film and comparative example 2 is the PET film from which the oligomer is not removed.

TABLE 1

|  | Comparative example 1 | Comparative example 2 | Embodiment example 1 |
| --- | --- | --- | --- |
| Light transmittance (%) | 54.0 | 91.0 | 92.8 |
| Haze (%) | 5.0 | 1.1 | 0.3 |
| Transverse modulus (GPa) | 3.9 | 4.3 | 4.7 |
| Longitudinal modulus (GPa) | 3.9 | 5.8 | 6.4 |
| Compressive strain (%) | 31.0 | 29.2 | 25.4 |
| Glass transition temperature (° C.) | 300 | 88 | 99 |
| Thermal shrinkage rate (%) | 0.05 | 1.10 | 0.20 |

The light transmittance and haze of the film indicate optical properties of the film. Referring to Table 1, the light transmittance of comparative example 1 is about 54% on average in the visible light range, and the light transmittance of comparative example 2 and embodiment example 1 is equal to or greater than about 90% on average in the visible light range. Also, the light transmittance of embodiment example 1 is about 92.8%, which is higher than the light transmittance of comparative example 2 by about 1.8%. Also, the haze of embodiment example 1 is less than the haze of comparative example 1 and comparative example 2. The haze of embodiment example 1 is about 0.3%, which is less than the haze of comparative example 1 by about 4.7% and less than the haze of comparative example 2 by about 0.8%.

As the light transmittance of the film increases and the haze of the film decreases, the film may exhibit superior optical properties. Embodiment example 1 includes the PET film having a light transmittance greater than that of the PI film, and thus embodiment example 1 may have greater light transmittance and a lower haze value than comparative example 1.

Embodiment example 1 may include the coating layer in contact with the one surface of the PET film, and thus the surface of the film may be smooth and flat. Accordingly, when compared with comparative example 2 including the same material film, the light transmittance of embodiment example 1 may be improved and the haze value may decrease because of the flat surface.

As the protective film having the improved optical properties is disposed to overlap the electronic module when viewed in a plane, the protective film may effectively transmit the optical signals transmitted to the electronic module and the optical signals output from the electronic module.

The transverse modulus, longitudinal modulus, and compressive strain of the film are indicative of mechanical properties of the film. Referring to Table 1, the transverse modulus of embodiment example 1 is about 4.7 Gpa, which is greater than that of comparative example 1 by about 0.8 Gpa and greater than that of comparative example 2 by about 0.4 Gpa. The longitudinal modulus of embodiment example 1 is about 6.4 Gpa, which is greater than that of comparative example 1 by about 2.5 Gpa and greater than that of comparative example 2 by about 0.6 Gpa. The compressive strain of embodiment example 1 is about 25.4%, which is less than that of comparative example 1 by about 5.6% and less than that of comparative example 2 by about 3.8%.

As the modulus value of the film increases and the compressive strain of the film decreases, the film is regarded as having mechanical properties which exhibit a relatively small degree of deformation against external force. In embodiment example 1, the proportion of the polymer having the molecular weight higher than that of the oligomer may be greater than that of the oligomer, and thus mechanical properties may be improved.

As the protective film having the improved mechanical properties is disposed under the display panel, the protective film may effectively protect the display panel. In addition, the degree of deformation of the protective film attributable to stress caused by repetitive folding and unfolding operations may be reduced.

In one embodiment, a manufacturing method of the display module may include mounting the driving chip on the display panel using a thermal compression process. Because the protective film having improved mechanical properties is disposed under the display panel, the degree of deformation of the protective film (caused by the thermal compression process) may be reduced, and the protective film may effectively prevent the display panel from being damaged due to the external force.

The glass transition temperature and thermal shrinkage rate of the film are indicative of the thermal properties of the film. Referring to Table 1, the glass transition temperature of comparative example 1 is greater than the glass transition temperature of embodiment example 1. Also, the thermal shrinkage rate of comparative example 1 is less than that of embodiment example 1. Accordingly, the thermal properties of the PI film may be superior to the PET film.

However, embodiment example 1 may have superior optical properties and mechanical properties compared with comparative example 1. Embodiment example 1 may have thermal properties suitable for the evaluation of reliability in high temperature and high humidity environments and also may have superior optical properties as described herein. However, comparative example 1 has thermal properties suitable for evaluation of reliability in high temperature and high humidity environments, but has poor optical properties. Accordingly, the protective film of the present disclosure may be the film having the small degree of deformation in the high temperature and the high humidity environments and having the superior optical properties.

Meanwhile, referring to Table 1, the thermal properties of embodiment example 1 may be improved when compared with comparative example 2 having the same material. The glass transition temperature of the embodiment example 1 is about 99° C., which is higher than that of comparative example 2 by about 11° C. Also, the thermal shrinkage rate of embodiment example 1 is about 0.2%, which is less than that of comparative example 2 by about 0.9%.

As the glass transition temperature of the film increases, reliability of the film with respect to the high temperature may be improved, and the degree of deformation of the film due to the heat may decrease as the thermal shrinkage rate of the film decreases. As a result, the thermal properties of the film are superior. When compared with comparative example 2 (which has relatively higher proportion of oligomer), higher thermal energy may have to be used to activate movement of the polymer in embodiment example 1. In addition, embodiment example 1 and comparative example 2 differ in the degree of the oligomer moving to the surface of the film by the heat provided thereto. Accordingly, the light transmittance of embodiment example 1 may not be deteriorated, even though embodiment example 1 undergoes the heat-set process to improve the thermal shrinkage rate of the film.

Because the protective film having improved thermal properties as described herein is disposed under the display panel, reliability of the display module under a high temperature environment may be improved. In one embodiment, the manufacturing method of the display module may include mounting the driving chip using the thermal compression process. In this case, the protective film may not be damaged due to the heat applied in the process of mounting the driving chip and thus may serve to effectively protect the display module.

Figure 8:
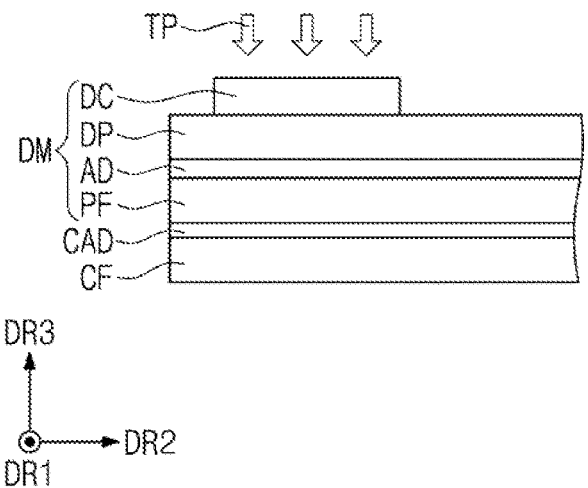
FIG. 8 illustrates a cross-sectional view of an embodiment of a method of evaluating properties of a display module.

FIG. 8 is a cross-sectional view showing an embodiment of a method of evaluating properties of the display module. The properties evaluation may be performed based on a process that involves determining how much stress the display panel DP receives during the mounting process, and, for example, may be accomplished through a process simulation in which the driving chip DC is mounted on the display panel DP.

The driving chip DC may be mounted on the display panel DP by thermal compression TP, and stress may be applied to the display panel DP during the thermal compression process. In addition, the protective film PF disposed under the display panel DP may be deformed by the thermal compression TP.

Meanwhile, the display module DM, provided in the mounting process of the driving chip DC, may include a carrier film CF attached to a lower portion thereof. The carrier film CF may be attached to the lower portion of the display module DM by a carrier adhesive layer CAD. The carrier film CF may be attached to the lower portion of the protective film PF and may prevent the protective film PF from being damaged by the external impacts or scratches during the manufacturing process.

Table 2 shows example results obtained by the method of evaluating properties of the display module DM shown in FIG. 8 with respect to embodiment example 2 and comparative example 3. Embodiment example 2 and comparative example 3 have configurations shown in FIG. 8, embodiment example 2 includes the PET film as described herein as its protective film PF, and comparative example 3 includes polyimide (PI) film as its protective film PF. Also, in Table 2, "driving evaluation" may be indicative of how many defects occur in the entire driving element after the thermal compression process, and "panel stress" may correspond to the stress value applied to the display panel during simulation of the thermal compression process.

|  | Embodiment example 2 | Comparative example 3 |
| --- | --- | --- |
| Driving evaluation | 1F/177 | 5F/177 |
| Panel stress (MPa) | 444.5 | 465.0 |

Referring to Table 2, the driving evaluation indicates that one driving element is defective out of 177 driving elements in embodiment example 2 and five driving elements are defective out of 177 driving elements in comparative example 3. Accordingly, it is predictable that a display module DM that includes a protective film PF according to embodiments described herein will have a low probability of occurrence of defects after the thermal compression process has been performed.

When comparing panel stress values, the panel stress of embodiment example 2 is about 444.5 Mpa, which is less than that of comparative example 3 by about 20.5 Mpa. Therefore, it is evident that the panel stress of embodiment example 2 is reduced by about 5% when compared with comparative example 3.

During the thermal compression process, one factor affecting panel stress is the thicknesses of the adhesive layer AD and the carrier adhesive layer CAD. When the thicknesses of the adhesive layer AD and the carrier adhesive layer CAD becomes are relatively thick (e.g., above predetermined value(s)), the stress applied to the display panel DP may increase in the thermal compression process. However, when the thickness of the adhesive layer AD is relatively thinner (e.g., below a predetermined value), the protective film PF may be detached and damaged. In embodiment example 2, the mounting process of the driving chip DC may be performed by placing the carrier adhesive layer CAD that is thinner (e.g., by about 5 µm) than that of comparative example 3 under the protective film PF. Accordingly, the stress applied to the display panel DP in embodiment example 2 during the thermal compression process may be reduced.

Additionally, in the case of embodiment example 2, no bubbles occur outside the driving chip DC after the driving chip DC mounting process. However, in the case of comparative example 3, bubbles occur outside the driving chip DC after the driving chip DC mounting process.

Accordingly, when compared with the case where the driving chip DC is mounted on the display panel DP and provided with a PI film disposed thereunder, mounting the driving chip DC on the display panel DP and providing the protective film PF including the PET film thereunder as described in accordance with one or more embodiments may reduce the degree of damage of the display panel DP, the protective film PF, and the driving chip DC.

Figure 9:
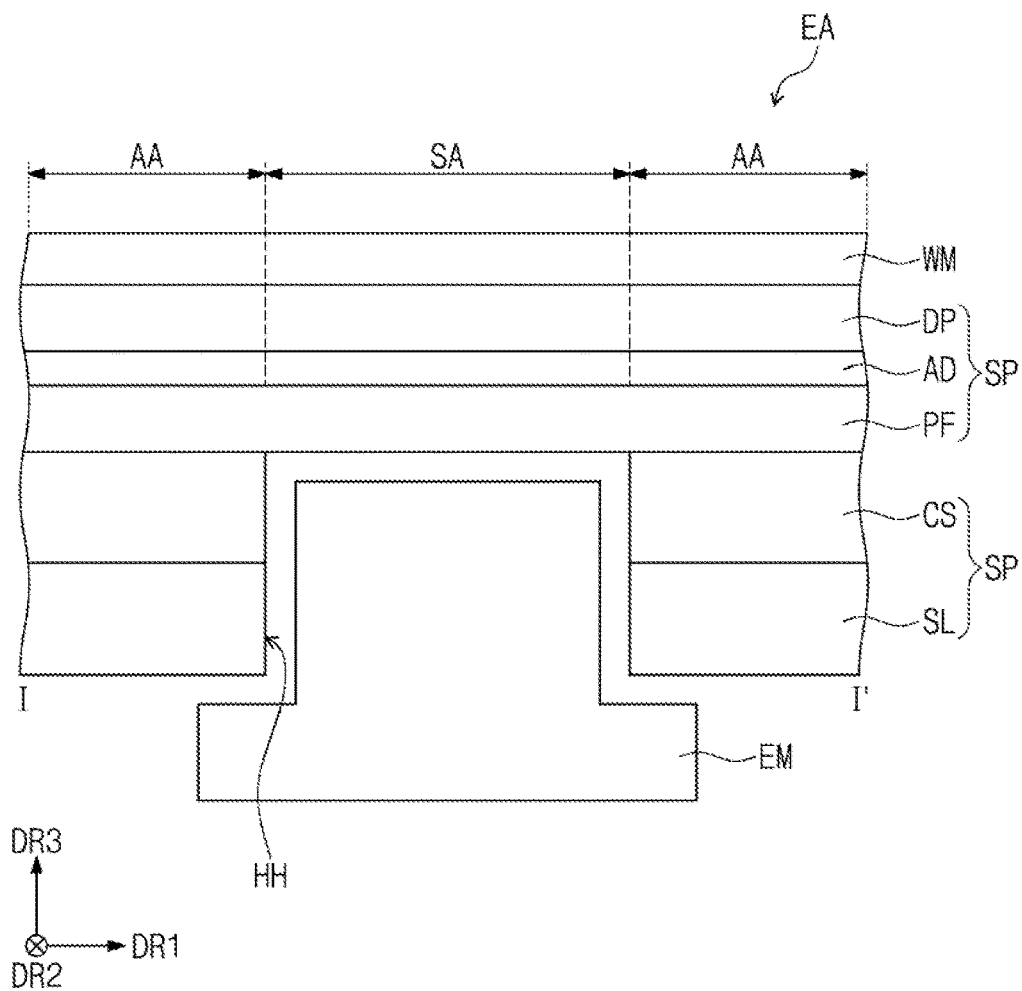
FIG. 9 illustrates a cross-sectional view of an embodiment of an electronic apparatus.

FIG. 9 is a cross-sectional view taken along a line I-I' of FIG. 2 to show an embodiment of an electronic apparatus. Referring to FIG. 9, in electronic apparatus EA, the hole HH may be defined through components disposed under the display module DM, and the hole HH may not be defined through the display panel DP in the display module DM. The sensing area SA overlapping the hole HH may correspond to a driving area of the display panel DP, and the images may be provided on the sensing area SA.

As described with reference to FIGS. 5 to 8, the protective film PF may be one having the improved optical properties, thermal properties, and/or mechanical properties in accordance with one or more embodiments described herein. As shown in FIG. 9, the protective film PF may overlap the electronic module EM when viewed in a plane. In addition, the protective film PF may be one in which light transmittance and haze are improved in accordance with one or more embodiments described herein. Accordingly, the protective film PF according to embodiments may effectively transmit optical signals output from the electronic module EM and optical signals provided to the electronic module EM.

According to an embodiment, in the protective film PF the light transmittance may not decrease under the high temperature environment, and haze may not increase under a high temperature environment. Accordingly, an electronic apparatus EA that includes the protective film PF according to one or more embodiments may maintain reliability with respect to the light transmission under a high temperature environment. Moreover, even when the electronic apparatus EA is exposed to a high temperature environment, light transmittance of the portion of the protective film PF overlapping the sensing area SA may not decrease, and the protective film PF may transmit optical signals.

In one embodiment, the support member SP in the electronic apparatus EA may include a cushion layer CL and a support layer SL. The support layer SL may be disposed under the cushion layer CL, and the hole HH may be defined through the cushion layer CL and the support layer SL.

The cushion layer CL may be disposed under the display module DM, and in one embodiment may be disposed on the lower surface of the protective film PF. The cushion layer CL may protect the display panel DP and the electronic module EM from external physical impact of the electronic apparatus EA. In addition, the cushion layer CL may have a predetermined thickness sufficient to form the hole HH into which at least a portion of the electronic module EM is inserted. For example, the thickness of the cushion layer CL may be equal to or greater than about 50 µm, but may have a different thickness in another embodiment.

In one embodiment, the cushion layer CL may include a material with superior impact absorption and a certain strength value. For example, the cushion layer CL may include at least one of acrylic-based polymer, urethane-based polymer, silicone-based polymer, imide-based polymer, or another material.

The support layer SL may be disposed under the cushion layer CL and may include a substrate that supports components on the support layer SL. The support layer SL may be a thin film metal substrate, but may be a substrate of a different material in another embodiment provided, for example, the substrate is able to support the components on the support layer SL. The support layer SL may have one or more functions, including but not limited to a heat dissipation function or an electromagnetic wave shielding function.

According to the embodiment, the display module may include any of the embodiments of the protective film disposed under the display panel. The protective film may include the PET film having improved thermal properties and optical properties achieved, for example, through the oligomer removing process. As a result, reliability of the display module may be improved. In addition, according to an embodiment the protective film may decrease stress applied to the display panel during the process of mounting the driving chip through a thermal compression process, and the degree of deformation due to the compression may be reduced.

In accordance with one or more embodiments, an electronic apparatus including a display module is provided to include an electronic module disposed under the display module. A protective film having improved optical properties, and which overlaps the electronic module, may effectively transmit light output from the electronic module or provided to the electronic module. In addition, damage to the electronic apparatus may be reduced when folding and unfolding operations are repeated under high temperature and high humidity environment conditions, and reliability of the electronic apparatus may be improved. Thus, according to one or more embodiments the electronic device may be foldable and may provide images to an area in which the display module overlaps the electronic module, which, in turn, may allow the size of the display area of the electronic apparatus to increase.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims. The embodiments may be combined to form additional embodiments.

What is claimed is:

1. A display module, comprising:
   a display panel comprising a display area and a non-display area adjacent to the display area;
   a protective film under the display panel; and
   an adhesive layer between the display panel and the protective film,
   wherein the protective film comprises a polyethylene terephthalate film from which at least a portion of an oligomer has been removed, and wherein the polyethylene terephthalate film has a glass transition temperature equal to or greater than about 95° C. from removal of the at least a portion of the oligomer.

2. The display module of claim 1, wherein the polyethylene terephthalate film has a light transmittance equal to or greater than about 90% in a wavelength range from about 400 nm to about 700 nm.

3. The display module of claim 1, wherein the polyethylene terephthalate film has a thermal shrinkage rate equal to or less than about 0.2% at a temperature of about 150° C.

4. The display module of claim 1, wherein the polyethylene terephthalate film has a haze equal to or less than about 1%.

5. The display module of claim 1, wherein the polyethylene terephthalate film has a modulus equal to or greater than about 4 GPa.

6. The display module of claim 1, wherein the protective film further comprises a coating layer in contact with one surface of the polyethylene terephthalate film.

7. The display module of claim 6, wherein the coating layer comprises an ion material having an anti-static function.

8. The display module of claim 6, wherein the coating layer has a thickness equal to or greater than about 0.5 μm and equal to or less than about 2 μm.

9. The display module of claim 1, wherein the adhesive layer comprises a pressure sensitive adhesive.

10. The display module of claim 1, wherein the adhesive layer has a thickness equal to or greater than about 15 μm and equal to or less than about 18 μm.

11. The display module of claim 1, further comprising a driving chip mounted on the display panel to overlap the non-display area.

12. The display module of claim 1, wherein the display panel is configured to fold and unfold about a folding axis extending in one direction.

13. An electronic apparatus, comprising:
   a display panel comprising a plurality of pixels, the display panel configured to fold and unfold about a folding axis in one direction;
   a window on the display panel;
   a protective film under the display panel;
   an adhesive layer between the display panel and the protective film;
   a support member disposed under the protective film and provided with a hole defined therethrough to overlap the display panel; and
   an electronic module in the hole, wherein the protective film comprises a polyethylene terephthalate film from which at least a portion of an oligomer has been removed, and wherein the polyethylene terephthalate film has a glass transition temperature equal to or greater than about 95° C. from removal of the at least a portion of the oligomer.

14. The electronic apparatus of claim 13, wherein the polyethylene terephthalate film has a thermal shrinkage rate equal to or less than about 0.2% at a temperature of about 150° C.

15. The electronic apparatus of claim 13, wherein:
   the protective film further comprises a coating layer in contact with one surface of the polyethylene terephthalate film, and
   the coating layer has a thickness equal to or greater than about 0.5 μm and equal to or less than about 2 μm.

16. The electronic apparatus of claim 15, wherein the protective film has a haze equal to or less than about 0.4%.

17. The electronic apparatus of claim 15, wherein the protective film has a light transmittance equal to or greater than about 92% in a wavelength range from about 430400 nm to about 700 nm.

18. The electronic apparatus of claim 15, wherein the coating layer comprises an ion material having an anti-static function.

19. The electronic apparatus of claim 13, further comprising:
   a driving chip mounted on the display panel and configured to provide electrical signals to the pixels.

20. The electronic apparatus of claim 13, wherein the electronic module comprises a camera module.

* * * * *